United States Patent
Tsironis (10) Patent No.: US 12,332,296 B1
(45) Date of Patent: Jun. 17, 2025

(54) ACTIVE LOAD PULL SYSTEM

(71) Applicant: Christos Tsironis, St-Laurent (CA)

(72) Inventor: Christos Tsironis, Kirkland (CA)

( * ) Notice: Subject to any disclaimer, the term of this patent is extended or adjusted under 35 U.S.C. 154(b) by 137 days.

(21) Appl. No.: 18/222,517

(22) Filed: Jul. 17, 2023

(51) Int. Cl.
*G01R 31/26* (2020.01)
*G01R 35/00* (2006.01)

(52) U.S. Cl.
CPC ....... *G01R 31/2607* (2013.01); *G01R 35/005* (2013.01)

(58) Field of Classification Search
CPC ............................ G01R 31/2607; G01R 35/005
See application file for complete search history.

(56) References Cited

U.S. PATENT DOCUMENTS

| | | | |
|---|---|---|---|
| 8,456,175 B2 | 6/2013 | Marchetti et al. | |
| 9,459,336 B1 * | 10/2016 | Tsironis | G01R 35/005 |
| 9,625,556 B1 | 4/2017 | Tsironis | |
| 11,006,288 B1 | 5/2021 | Tsironis | |

OTHER PUBLICATIONS

B. Thorsell et al. "Fast Multiharmonic Active Load-Pull System With Waveform Measurement Capabilities," in IEEE Transactions on Microwave Theory and Techniques, vol. 60, No. 1, pp. 149-157, Jan. 2012). (Year: 2012).*
"A New Load-pull Characterization Method for Microwave Power Transistors," Y. Takayama, [online], 1976 IEEE Microwave Theory & Techniques Society (MTT-S) International Microwave Symposium, pp. 218-220. [Retrieved on Apr. 6, 2017]. Retrieved from Internet <URL: http://ieeexplore.ieee.org/document/1123701/>.
"Active Load Pull System, ALPS", Product Note 33, Focus Microwaves, Apr. 1996, p. 3, Figure 3.
"Computer-Aided Error Correction of Large-Signal Load-Pull Measurements", Tucker, R.S. and Bradley P., [online], IEEE Transactions on Microwave Theory and Techniques, vol. MTT-32, No. 3, Mar. 1984, pp. 296-300. [Retrieved Apr. 6, 2017]. Retrieved from Internet < URL: http://ieeexplore.ieee.org/document/1132668/>.
"Comparison of Active Versus Passive On-wafer Load-pull Characterization of Microwave and Millimeter-wave Power Devices," J. E. Muller and B. Gyselinckx, [online], 1994 IEEE MTT-S Digest, CH3389-4/94/0000-1007$01.00, pp. 1007-1080, Figure 1, [Retrieved Apr. 6, 2017]. Retrieved from Internet < URL: http:/ieeexplore.ieee.org/ el5/1100/7886/00335168.pdf>.
"Arbitrary waveform generators" [online] Tektronix website [Retrieved on Jan. 24, 2023] Retrieved from Internet <URL: http://tek.com/en/products/arbitrary-waveform-generators>.
"Vector Signal Analyzer", Agilent Application Note 150-15: Vector Signal Analysis Basics.

* cited by examiner

*Primary Examiner* — Giovanni Astacio-Oquendo
*Assistant Examiner* — Dilara Sultana (57) ABSTRACT

A calibration and impedance synthesis (tuning) method for active load pull systems employs prior calibration and dynamic interpolation routines. Since active load pull systems differ from passive load pull systems in that the device under test (DUT) is part of the tuner, in large signal the tuner cannot be calibrated independently. The new active load pull system comprises an impedance generation algorithm based on prior calibration and dynamic in memory interpolation routines. At small signal levels the procedure is like with passive load pull tuners. At higher power, where the DUT becomes nonlinear, the calibration yields only approximate data. For load pull contour generation this is still adequate.

6 Claims, 7 Drawing Sheets

ACTIVE LOAD PULL SYSTEM

PRIORITY CLAIM

Not Applicable

CROSS-REFERENCE TO RELATED ARTICLES

1. "A New Load-pull Characterization Method for Microwave Power Transistors," Y. Takayama, [online], 1976 IEEE Microwave Theory & Techniques Society (MTT-S) International Microwave Symposium, pp. 218-220. [Retrieved on 2017 Apr. 6]. Retrieved from Internet <URL: http://ieeexplore.ieee.org/document/1123701/>.
2. "Active Load Pull System, ALPS", Product Note 33, Focus Microwaves, April 1996, page 3, FIG. 3.
3. "Computer-Aided Error Correction of Large-Signal Load-Pull Measurements", TUCKER, R. S. and BRADLEY P., [online], IEEE Transactions on Microwave Theory and Techniques, vol. MTT-32, No. 3, March 1984, pp. 296-300. [Retrieved 2017 Apr. 6]. Retrieved from Internet <URL: http://ieeexplore.ieee.org/document/1132668/>
4. "Comparison of Active Versus Passive On-wafer Load-pull Characterization of Microwave and Millimeter-wave Power Devices," J. E. Muller and B. Gyselinckx, [online], 1994 IEEE MTT-S Digest, CH3389-4/94/0000-1007$01.00, pp 1007-1080, FIG. 1, [Retrieved 2017 Apr. 6]. Retrieved from Internet <URL: http://ieeexplore.ieee.org/iel5/1100/7886/00335168.pdf>.
6. Marchetti, M. et al. U.S. Pat. No. 8,456,175, "Open Loop Load Pull Arrangement with Determination of Injections Signals".
7. Tsironis, C. U.S. Pat. No. 9,625,556, "Method for Calibration and Tuning with Impedance Tuners".
8. Tsironis, C. U.S. Pat. No. 11,006,288, "Method for Experimental Verification of RF Matching Networks".
9. "Arbitrary waveform generators" [online] Tektronix website [Retrieved on 2023 Jan. 24] Retrieved from Internet <URL: http://tek.com/en/products/arbitrary-waveform-generators>
10. "Vector Signal Analyzer", Agilent Application Note 150-15: Vector Signal Analysis Basics.

BACKGROUND OF THE INVENTION

Figure 1:
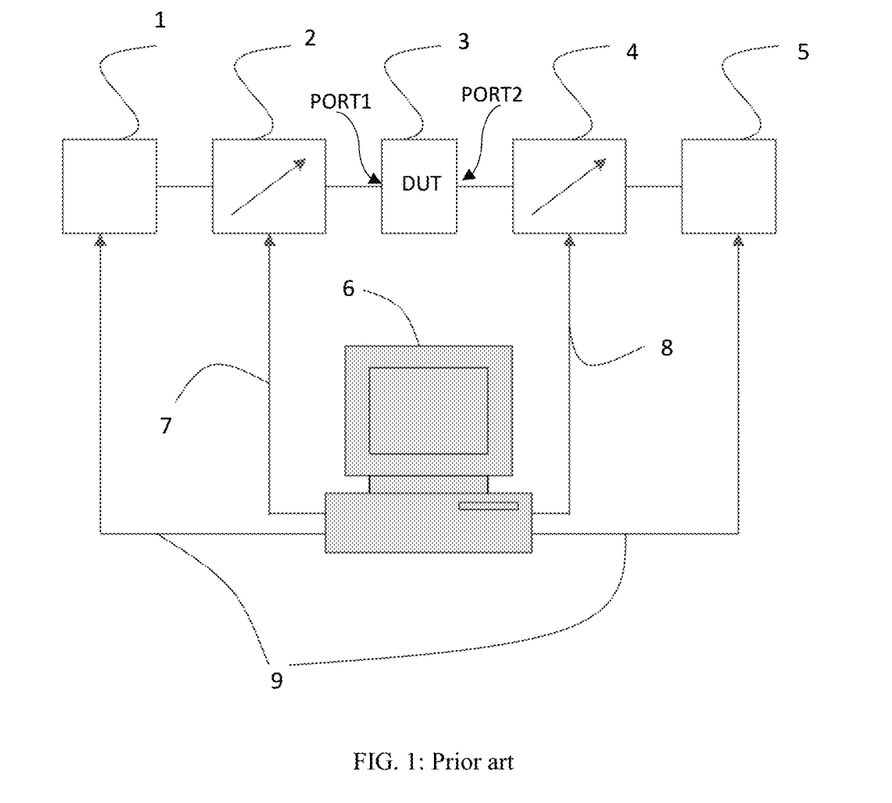
FIG. 1 depicts prior art, a typical automated load pull test system.

This invention relates to linear (small signal) and nonlinear (large signal) testing of microwave transistors (device under test, DUT). FIG. 1 shows a traditional load pull system: a PC controller 6 controls, using digital cables 7, 8 and 9, a signal source 1, a power meter 5 and two impedance tuners 2 (input) and 4 (output) connected to the device under test (DUT) 3. The tuners 2 and 4 set the RF impedances at the DUT ports and the system measures the DC and RF behavior of the DUT and the results are processed into ISO contours (load pull contours), which allow the circuit (amplifier) designer to navigate and create his matching networks for specific specifications. It is the equivalent of a cartographer who creates maps allowing a traveler to go to his objective.

When power transistors are driven in the nonlinear operation regime, the internal impedance at the output (typically Drain-Source, or Emitter-Collector terminals) is very low (1-3Ω). An impedance tuner used to match the transistor must also physically synthesize such impedance. Passive impedance tuners can reach, at their test port reference plane, a tuning range (maximum reflection factors $|\Gamma_{tuner}|$) of the order of 0.95, corresponding to impedances R of 2.4Ω (R=50Ω*(1−0.95)/(1+0.95)). The insertion loss of the transmission between DUT and tuner, created by the required adapters, cables etc., reduces the available tuning range at the DUT reference plane and thus the capacity of the passive tuner to conjugately match the transistor. A popular remedy to this limitation is using active systems, i.e., test systems whereby an adjustable signal coherent (synchronous) with the signal injected into the transistor by the source 1, is injected independently into the DUT output terminal, and creates a virtual (not physical) load; (Load=Received/Emitted signal).

This additional signal can be either the only one injected, in which case we speak of "active" load pull, or it can be superimposed (vector-added) to signal reflected by an in-series passive tuner 4, in which case we speak of "hybrid" load pull; obviously, if only a passive tuner is present, we speak of "passive" load pull. The setup of FIG. 1 can be active or passive, depending on the nature of the tuners. In both active injection cases (purely active and hybrid) the objective is reaching and matching the conjugate complex internal impedance of the transistor; in general terms a standard requirement is reaching a reflection factor $|\Gamma|=1$ (corresponding to an internal impedance real part of 0Ω) at the DUT ports. Because of the non-linearity of the DUT, active tuners are considered non-calibrable and use, instead, in-situ measurement of the actual load impedance, and steer to a target impedance (tune) using a trial-and-error iterative measurement process (see ref. 6). The objective of this invention is a new method of pre-calibrating the active tuner, in an approach in the lines of ref. 7, and using calibration data for an in-memory, much faster impedance synthesis and tuner setting process.

DESCRIPTION OF PRIOR ART

Figure 2:
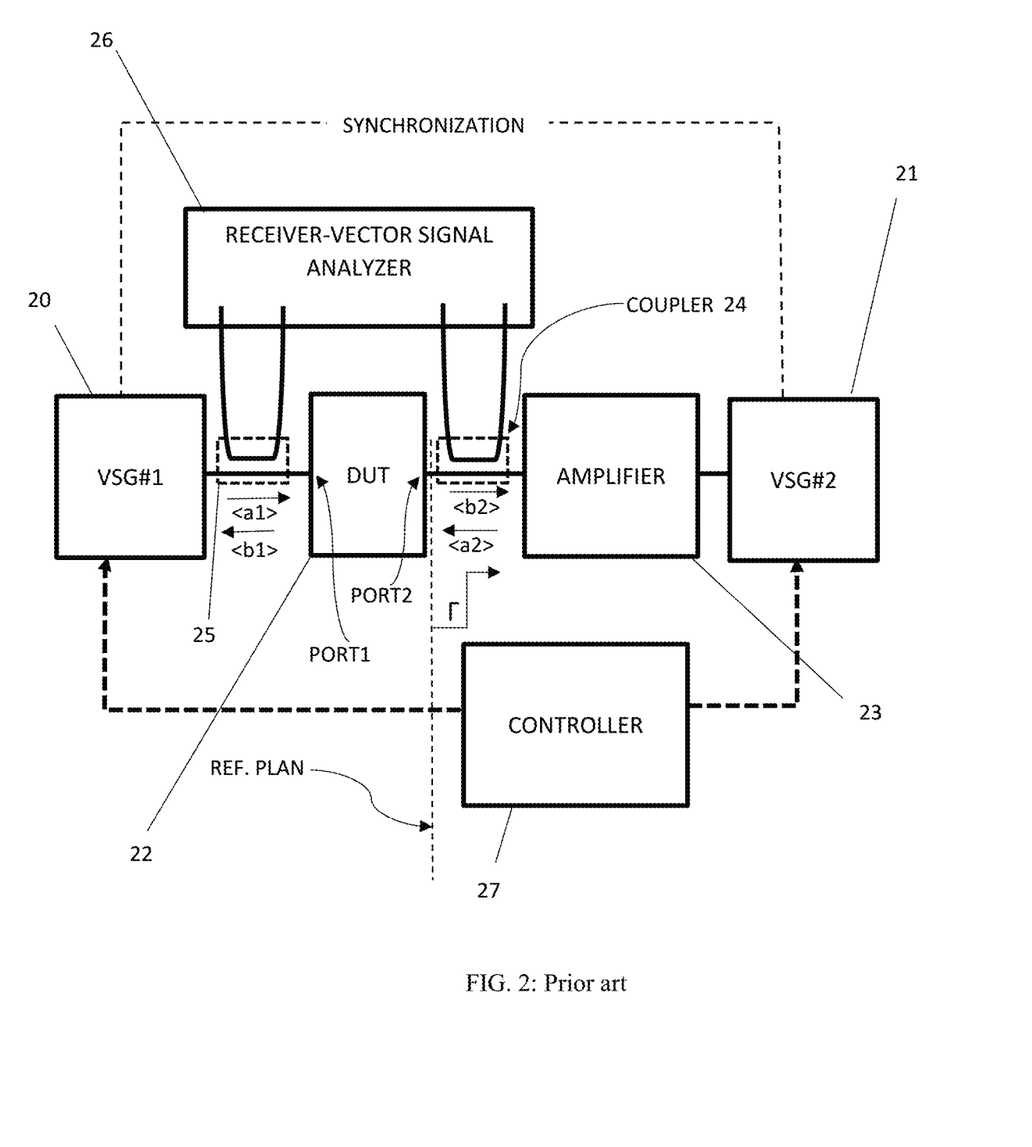
FIG. 2 depicts prior art, a typical automated "open loop" active load pull system.
Figure 3:
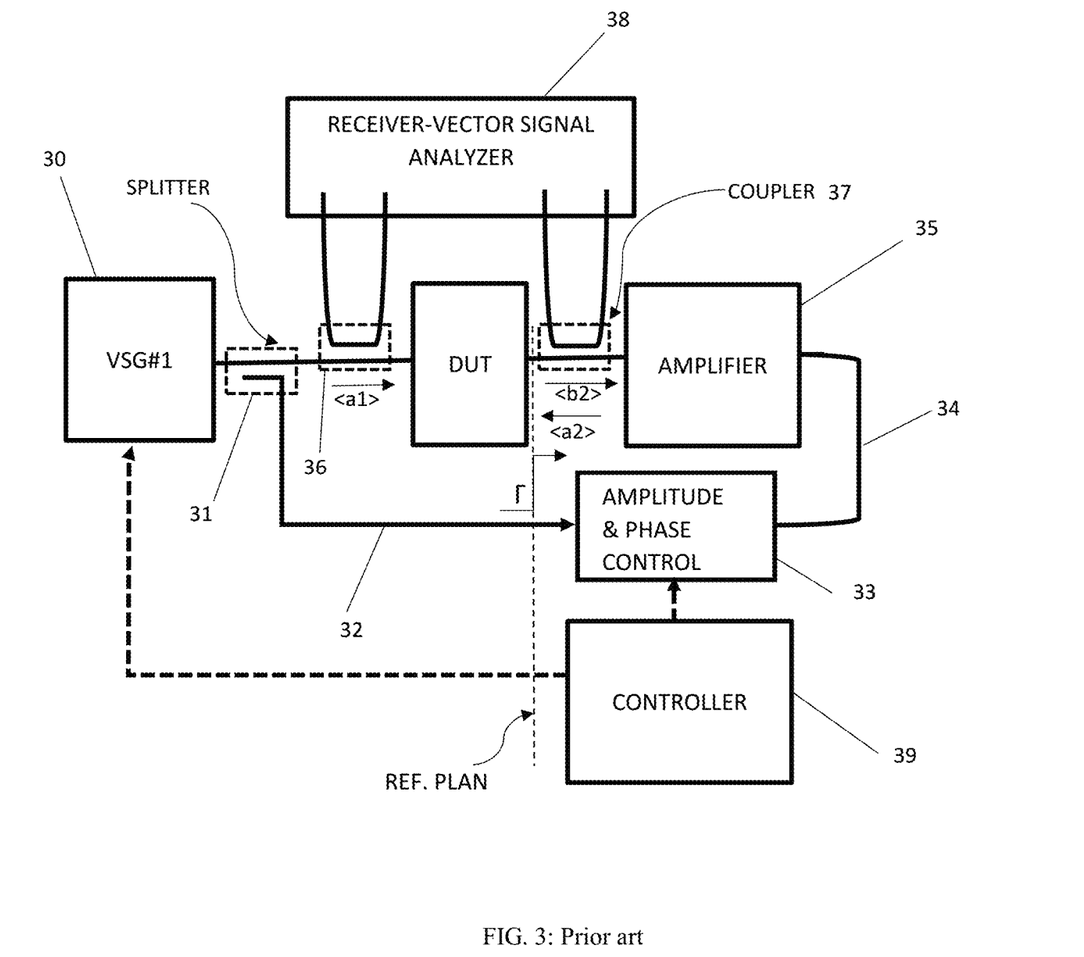
FIG. 3 depicts prior art, a typical automated "split signal" active load pull system.

There have been several active load pull systems, starting back in the 70'ies (see refs. 1 to 4). These load pull techniques use the so-called "virtual load" method (FIGS. 2 and 3). The virtual load method consists of injecting into the output port of the DUT RF power <a2> synchronous with the power <a1> injected into the input port, which is traversing the DUT from the input to the output, but with controlled phase and amplitude. Knowing that the reflection factor "seen" by the DUT is equal to the ratio of returned (normally "reflected") power wave <a2> to primary output power wave <b2>: (Γ=<a2>/<b2>), it is understood that by controlling the phase and amplitude of <a2> we can control Γ. There are several ways to do this: One is to use an "active load" technique (see ref. 2). In this case part of the outgoing power <b2> ($P_{out}$) is split into a directional coupler, filtered, phase adjusted, amplified, and re-injected into the output port of the DUT, which will "see" a complex load Γ as described above. Another method (FIG. 3 and ref. 1) is to split 31 the signal before the DUT or use two synchronized RF sources (FIG. 2 and ref. 3) one to inject RF power into the input port of the DUT and one into its output port. Since the sources are synchronized, they can generate a coherent signal and if we adjust the relative phases between the sources and the amplitude of the second source, then the DUT will, again, see at its output port a "virtual" load Γ, as described earlier.

BACKGROUND OF THE INVENTION

It is important to understand that an active or hybrid load pull system is fundamentally different than a passive system.

In a passive system the DUT and the tuner are two independent entities. One can change independently of the other: the changes of the DUT do not affect the tuner. In an active system this is not possible; here the changes of the DUT may affect the tuner, or, to speak of, the DUT is part of the tuner: in a passive system the returning signal <a2> is proportional to the outgoing signal <b2>, it cannot be larger than <b2> and the ratio $\Gamma$=<a2>/<b2> is constant. In an active system <a2> is controlled independently of <b2> and can be made smaller equal to or larger than <b2>, and, because of that, the DUT is, in fact, part of the load pull system. This means we should not talk about an active tuner, but of an active load pull system, that includes an interdependent active tuner portion. In the sense, though, that a passive tuner controls the amount of reflected signal <a2>, the adjustment of the actively injected <a2> using a separate signal source or an active feedback loop, can be viewed as a special case of passive tuner. This is what this invention does.

SUMMARY OF THE INVENTION

The configuration used in this invention is the two independent signal sources method, also called Open Loop Method, FIG. 2. This configuration permits the two independent signal sources to carry different modulation schemes. If the signal is not modulated, the second signal source can be replaced by a branch of the first signal extracted via a directional coupler, or signal splitter and re-injected into the output of the DUT after amplification and amplitude and phase modification to create <a2>, as in FIG. 3. In both cases <a2> can be controlled, independently of <b2> and create a multitude of $\Gamma$=<a2>/<b2> values covering a section or the totality of the Smith chart. Since <b2> is the departing power wave of the DUT, it changes with the injected power <a1>; this means that depending on each <a1> affects the control of <a2> in creating independently $\Gamma$; a calibration of the system includes, therefore, a third parameter in addition to the amplitude and phase of <a2>: the injected signal power <a1>; by consequence the stimuli to be controlled are the amplitude and phase of <a2> and <a1>, because to create a desired $\Gamma$ we must consider <a2>=$\Gamma$*<b2 (a1)>.

BRIEF DESCRIPTION OF THE SEVERAL VIEWS OF THE DRAWINGS

The invention and its mode of operation will be more clearly understood from the following detailed description when read with the appended drawings in which.

DETAILED DESCRIPTION OF THE INVENTION

The active load pull system to be calibrated is shown in FIGS. 2 and 3; FIG. 2 shows the open loop system, which uses two synchronized signal sources (arbitrary waveform generators AWG or vector signal generators VSG #1 and VSG #2, see ref. 9) 20 and 21; source 20 injects radio frequency (RF) signal into the input port (port 1) of the DUT 22 and source 21 into the output (port 2) of the DUT. Since the DUT has, normally, gain i.e., <b2>≥<a1>, to match the outgoing signal power <b2>, the signal <a2>, originating at the source 21, must be amplified using a power amplifier 23. Bidirectional signal couplers 24 and 25 serve to sample and measure power waves, <a1>, <a2> entering and <b1>, <b2> departing from the DUT, using the vector receiver (vector signal analyzer 26 (see ref. 10). The signal sources 20 and 21 can control amplitude and phase of the generated signal and are synchronized, i.e., they use the same clock frequency and, if they are modulated, the same time duration of their, possibly different, modulation patterns. The whole operation is controlled by controller 27, which is also linked digitally to vector signal analyzer 26 (link not shown here).

FIG. 3 shows a different active load pull system configuration, using a single vector signal generator VSG #1, item 30, and a power splitter 31, which extracts a portion 32 of the signal and injects it into an amplitude and phase modulator 33 and then 34 into the feedback amplifier 35; incident and outgoing signal waves <ai> and <bi> (i=1, 2) are sampled using the bidirectional couplers 36 and 37 and measured using the vector signal analyzer 38; the whole operation is controlled by the controller 39, which is also linked digitally to the vector signal analyzer 38 (link not shown here) for configuration, triggering and data collection. The amplitude and phase controller creates a signal, synchronized with the original signal from source 30, but with adjustable amplitude and phase, which is amplified and injected as <a2> into the DUT, creating the desired $\Gamma$=<a2>/<b2>, which is measured by the vector signal analyzer 38 via the coupler 37.

Since we can control <a2> and measure <a2> and <b2>, we can determine the actual reflection factor $\Gamma$ "seen" by the DUT at its output port. This allows similar calibration as in ref. 7; it is not exactly an independent tuner calibration, it is a system calibration, since the DUT cannot be separated from the tuner; this means that, if the DUT changes, the calibration also changes. To make the approach practical, the calibration must be carried through for several DUT conditions, like bias and input power and then interpolate between them; the interpolation, either between bias or input power points will create errors; but this is irrelevant, since we are going to measure the $\Gamma$ presented to the DUT for each <a2> and map the real result. The calibration, even if not completely accurate, helps position <a2> close to the expected value, at very high speed, avoiding measuring iterations as taught in ref. 6.

Figure 4:
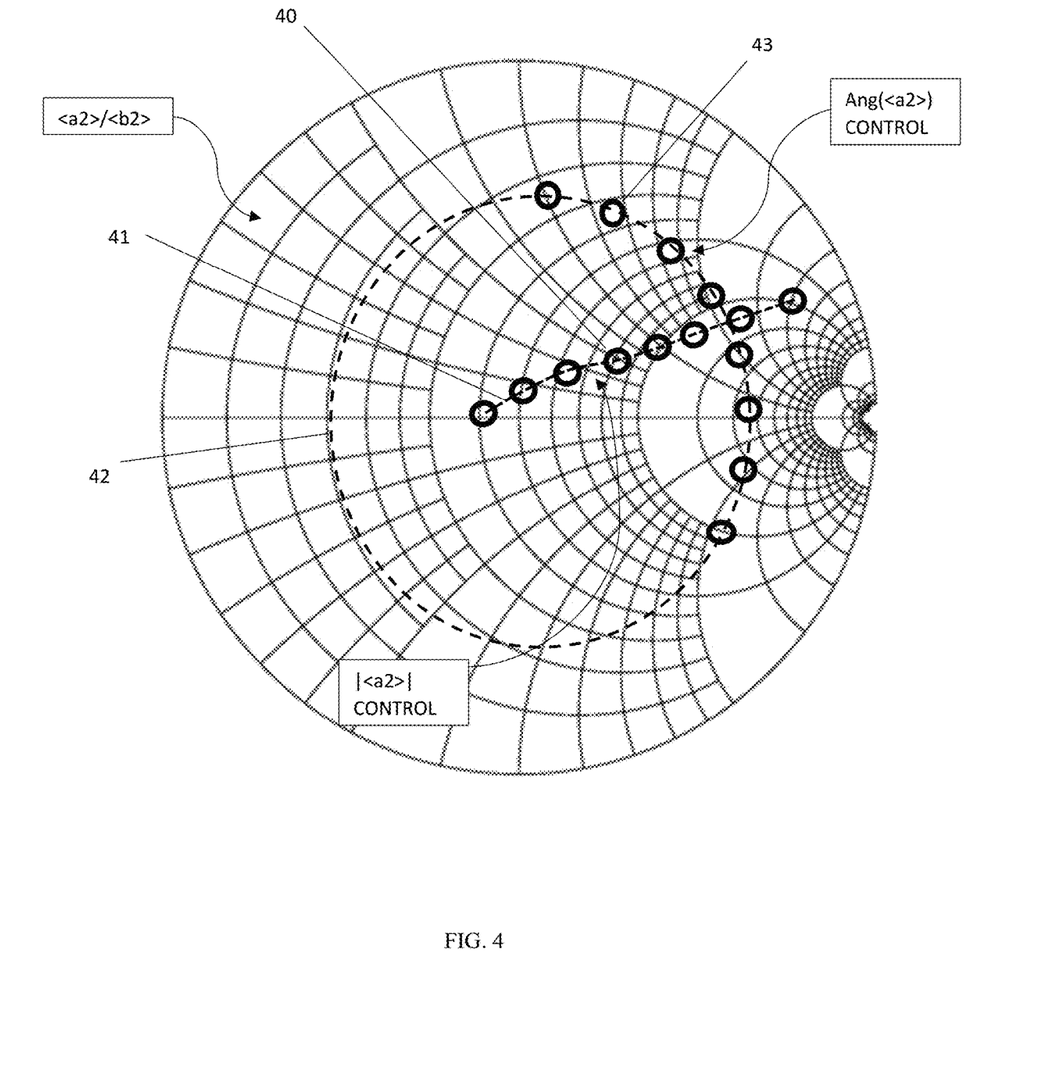
FIG. 4 depicts calibration point location on the Smith chart as a function of stimulus.

A typical calibration pattern is shown in FIG. 4: the round dots 40, 43 correspond to calibration points; the traces 41, 42 correspond to amplitude (41) and phase (42) control of the feedback signal <a2>. When changing the phase of <a2> we get contours 42 that look like circles. They are not exactly circular (FIG. 7), because <b2> changes with <a2>, less in the linear regime of the DUT (as seen by the insert A in FIG. 7), more in the nonlinear regime. When changing the amplitude, we get arcs that start close to the center of the Smith chart and reach close to |$\Gamma$|≈1. Since the contours can be grossly deformed (see measured data in FIG. 7) it is important to determine an angle $\Phi=\text{ang}(<a2>)$ to initiate the amplitude scaling, to create the trace 41 and the points 40. A simple way for doing this is to first inject a medium value power $<a1>$ into the DUT, in form of P1, which will create a sizeable output signal $<b2>$; then inject enough $<a2>$ power until $|<a2>|$ is similar or equal to $|<b2>|$, thus creating a sizeable $|\Gamma|=|<a2>|/|<b2>|$ around 0.5-0.7. Subsequently we step through the phase of $<a2>$ until $|\Gamma|$ becomes maximum and hold on to this phase, which we can call $\Phi c$ for "center" phase.

Figure 6:
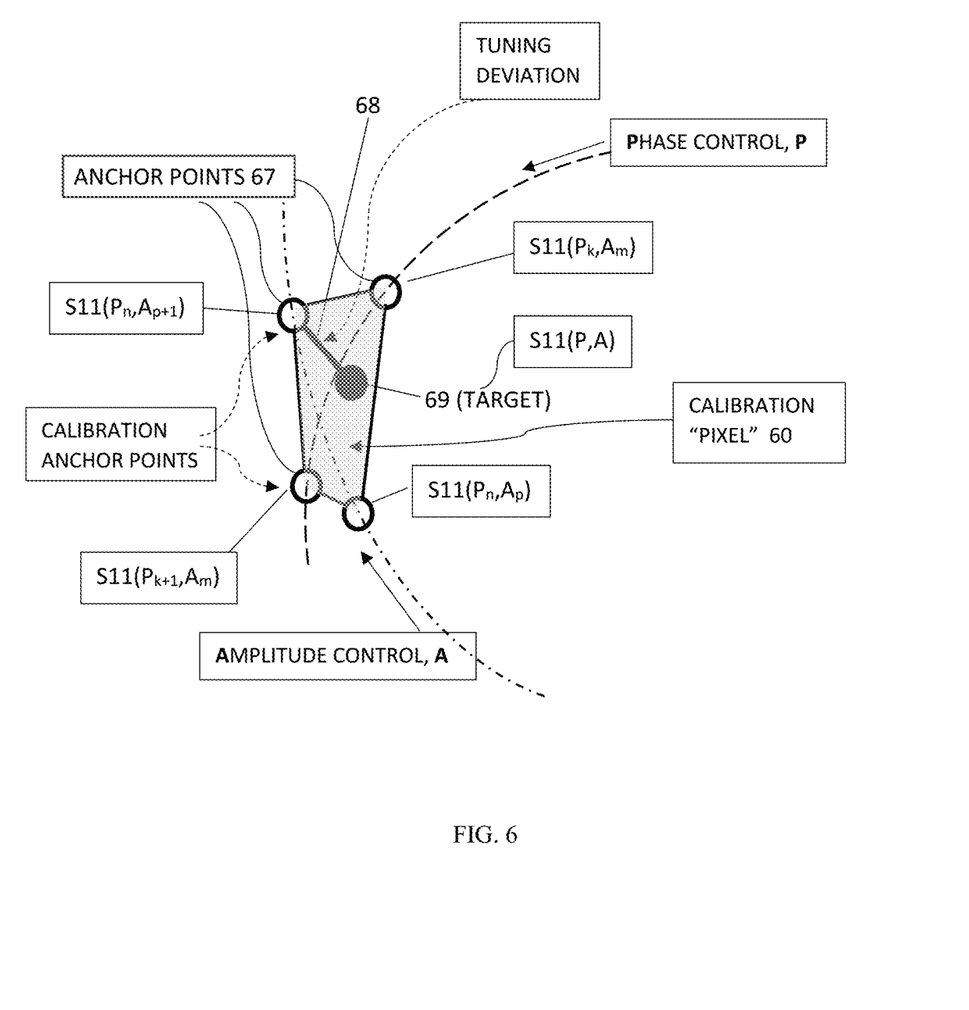
FIG. 6 depicts the interpolation and tuning mechanism of the pre-calibrated active load pull system.

Subsequently we perform a scaling process: this determines the amplitude of $<a2>$ required for the various $|\Gamma|$ levels to run the 42 (FIG. 4) traces. For this we increase the power of the feedback signal et constant phase and register $|<a2>|$ for typically 8-10 $|\Gamma|$ levels, like $|\Gamma|=0.1$, 0.2, 0.3 ... 0.9, 1.0 ... and save the associated $|<a2>|$ in a scaling table $|<a2>|(0.1) ... |<a2>|(0.9) ....$ When the scaling phase is terminated, we retrieve and set the amplitudes of $<a2>$ for the various levels and step through the phase of $<a2>$ from an arbitrary $\Phi2\text{-}0$ to $\$2\text{-}360$ degrees in increments of, typically, 10 degrees and measure and save $<a2>$, $<b2>$, $\Gamma=<a2>/<b2>$ and the associated input power P1, which creates $<a1>$. This creates a reflection factor pattern including roughly 300-400 points over the Smith chart like in FIG. 7. For this pattern we know how each $\Gamma$ point has been created because the only stimulus we control is amplitude and phase of $<a2>$, i.e., we can save in one row $\Gamma$, $|<a2>|$, angle $(<a2>)$; $(<b2>$ is implicitly known through $\Gamma$); once terminated we eliminate all points for which $|\Gamma|>1$, because it corresponds to unrealistic test conditions. The measured data rows are saved in calibration files, one file, or segment of larger file, for each input power P1 and/or DUT bias conditions. This data are then used for tuning and interpolations as described below:

Reviewing FIG. 6 shows how interpolation, i.e., finding the reflection factor S11(P, A) 69 at any value of the stimuli A (amplitude) and P (phase) of the signal generated by the second vector signal generator (VSG #2) between calibration points, works. FIG. 6 shows a calibration "pixel", i.e., a trapezoid area defined by the four calibration (anchor) points 67 closest to a target reflection factor 69. Once the target reflection factor 69 is defined, the software searches the two pairs of successive reflection factor S11 calibrated points, closest to the target, two for amplitude A variation and two for phase P variation. Let us name these points $S11((P_n,A_p))$, $S11(P_n,A_{p+1})$ for amplitude A change and constant phase P, and $S11(P_k,A_m)$, $S11(P_{k+1},A_m)$ for phase P change and constant amplitude A. Here indexes n, p, k, m are integers indicating the position of each calibration point in the matrix. If we have 10 concentric amplitude contours and 10-degree phase steps, then p and m will run between 1 and 10 and n and k between 1 and 36. If some points are excluded because they generate $|\Gamma|>1$ then these numbers may be smaller. In a first rough approximation, assuming the target 69 is included in the polygon formed by the calibration points 67 etc. then the S11 of the target will be calculated as the vector sum of the S11 of the four selected calibration points divided by 4; an empirical search criterion can be added verifying if the vector difference between any of the selected calibration points and the target is smaller than the vector difference between any two calibration points, then assign the value of the closest point to the target to the target itself. Another method could be to make one or more iterative linear real and imaginary part interpolations between the calibrated anchor points 67; in general, the higher the resolution of calibrated anchor points, the better the tuning accuracy.

Linear interpolation uses the following approximation relationship, based on FIG. 6, assuming the requirement is the reflection factor S11(P,A) at a reverse injected power A (amplitude) and phase P (phase): $2*S11(P,A)=S11(P_k+1, A_m)+ (P-P_{k+1})/(P_k-P_{k+1})*\{S11(P_{k+1},A_m)-S11(P_k,A_m)\}+ S11(P_n,A_{p+1})+ (A-A_{p+1})/(A_p-A_{p+1})*\{(S11\ (P_n,A_{p+1})-S11(P_n,A_p))\}$, wherein indexes k,m,n,p are the coordinates of the selected calibration anchor points shown in FIG. 6.

Based on the analysis of FIG. 6 it is also possible to establish a method for impedance synthesis (tuning), ie. Minimize the vector distance 68 between the target 69 and an interpolated point: assuming the requirement is not the value of the reflection factor S11 for a feedback injection setting (A,P), i.e., S11(A,P) item 69 in FIG. 6, which is the objective of the interpolation, but it is finding A and P of the second source VSG #2 to create the S11 of item 69, always knowing the anchor points 67 of FIG. 6: This can now be done, very fast, in memory, using the existing data; for that a series of interpolations using the above relations is executed, and each interpolation creates a new set of virtual calibration points, which are used for the next interpolation and comparing with the target value; this creates a quasi-instantaneous numeric iteration sequence that leads to the target values A and P, within the pre-defined A and P resolution.

Interpolation is also possible between input power P1 settings and bias settings. The calibrations are saved in data blocks, each block containing a header with a third stimulus, like the input power P1, or a DC bias parameter (Drain voltage, Gate voltage etc.) and the same internal stimuli A,P as in every other block. If the data are organized this way, then a linear interpolation of data between third stimulus values is possible. None-the-less, because of lurking and not easily detectable non-linearities during tuning, the calibration data are used only as reference values steering the tuning process in the vicinity of the target values, which in reality are irrelevant, because, once the stimuli A and P are set, the real $\Gamma=<a2>/<b2>$ is measured using the coupler 24 (FIG. 2). The data are presented in ISO contour format, generated using real measured reflection factors $\Gamma$ and the associated RF parameters, all measured using the vector signal receiver and other auxiliary instruments, like power meters, spectrum analyzers, bit error analyzers or DC volt- and ampere-meters.

Figure 7:
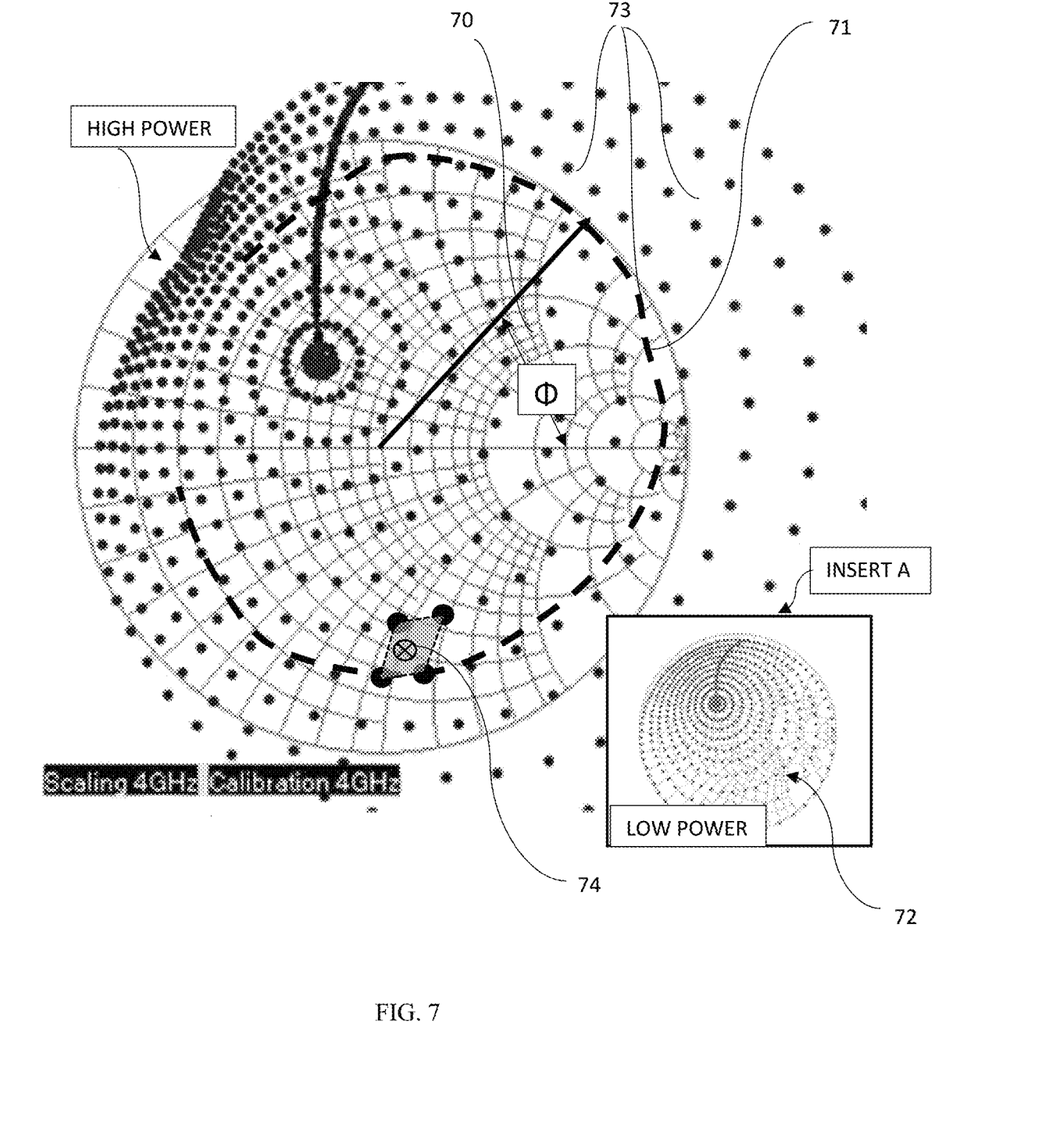
FIG. 7 depicts calibration points of a split signal active load pull setup at medium input signal power. Insert A in the figure depicts the same calibration points of the same active system at low input signal power.

FIG. 7 shows a measured calibration pattern of an active system as in FIG. 3. At low power the calibration points are almost as described in FIG. 4, shown in the insert 72 of FIG. 7; to execute the scaling process we need to find the right angle $\Phi$ as shown by arrow 70, which points to a maximum expansion of the $5^{th}$ contour 71, associated with the $5^{th}$ value of the amplitude A of the injecting output signal. Also obvious are the calibrated points 73 to be eliminated from the pattern creating a reflection factor $|\Gamma|>1$. Also shown is a target impedance 74 inside an interpolation "pixel" equivalent to the pixel 60 in FIG. 6.

If the input signal is not a single frequency but modulated, as is typical in communication, then only a setup as in FIG. 2 with two synchronized signal generators can be used, because a frequency modulation creates undesired in-band phase skewing. To counter this phenomenon the modulation pattern of the feedback injection source must be designed to compensate for any amplitude and phase skewing, created by the DUT, the feedback amplifier, and the setup transmission lines. This capacity of the system is also used to emulate, in a realistic environment, any passive matching network, to be attached to the DUT in a planned amplifier circuit (see ref. 8).

Figure 5:
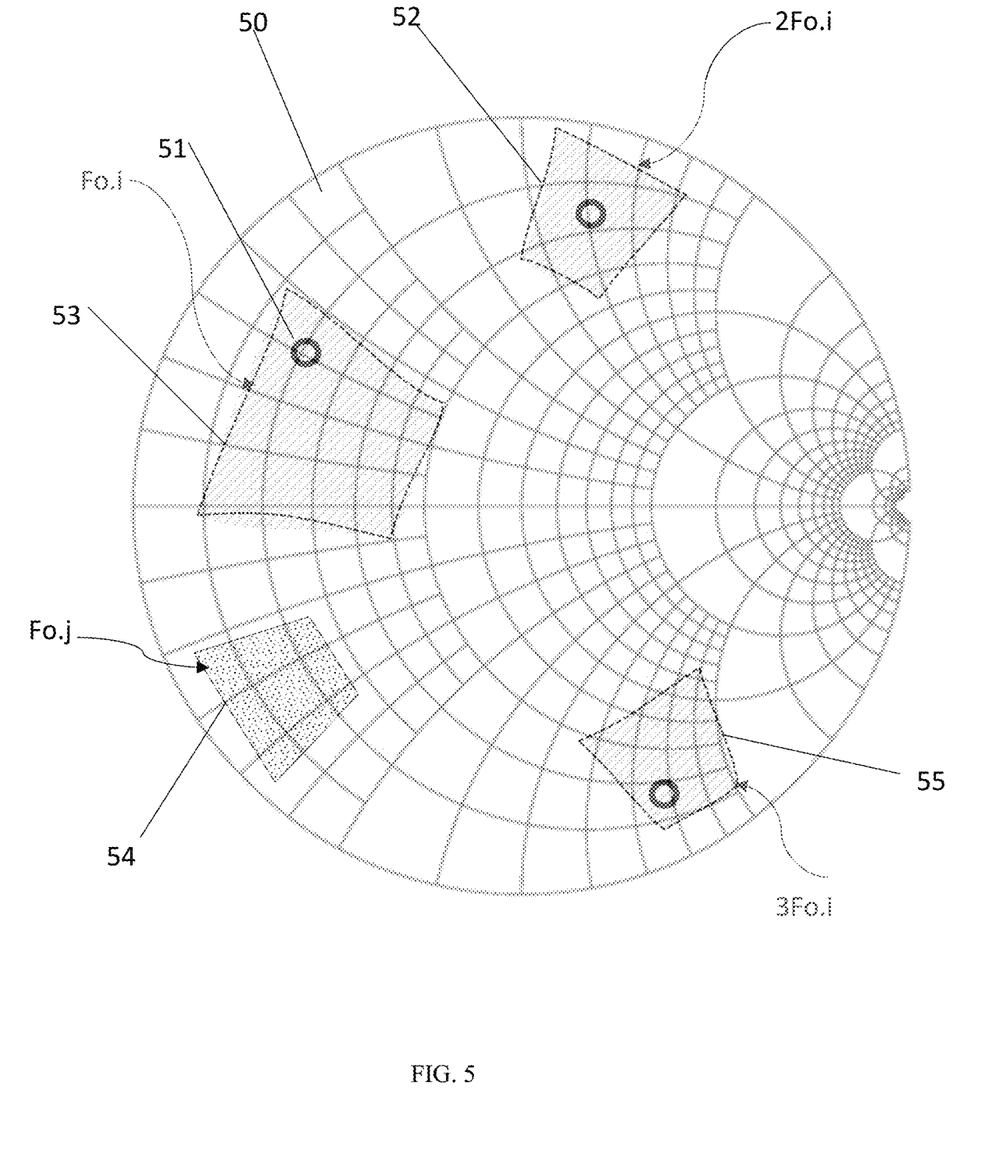
FIG. 5 depicts harmonic tuning target segments on the Smith chart.

Harmonic tuning, i.e., the capacity of a load pull tuner system to synthesize with a certain accuracy impedances at the fundamental Fo frequency ad one or more harmonic frequencies 2Fo, 3Fo . . . is an ambitious task, especially when covering high bandwidths of several octaves (1-18 GHz, 2-40 GHz, etc.). Analytical solutions, based on physical models, have been abandoned from the early days of the specific technology, since they do not offer acceptable accuracy. The remaining alternative is creating a large number of tuning states and search systematically for tuning solutions numerically. To do so we use a search strategy, (FIG. 5), by which the Smith chart 50 is divided in a number of segments 52, 53, 55: segment 53 around the Fo targets 51, segment 52 around the 2Fo targets and segment 55 around the 3Fo targets indexed "i" or a series of 54 segments for targets indexed "j", and execute a subsequent numeric search in this much more limited space inside the segments, allowing a reduction of search time by orders of magnitude, because all that happens exclusively in computer memory.

Obvious alternatives of the herein disclosed calibration and tuning methods of an open loop and a split signal active load pull system shall not encroach on and erode the general validity of the idea of calibrating an active load pull system and using the calibration data for tuning and load pull measurements.

What is claimed is:

1. A calibration method for an active load pull system, which includes:
   a device under test (DUT), a first vector signal generator (VSG #1) injecting radio frequency (RF) power P1 into an input port #1 of the DUT, a second vector signal generator (VSG #2) injecting RF power P2 into an output port #2 of the DUT, and measurement capability of the RF signal power waves entering ($<a1>,<a2>$) into the input and departing ($<b1>,<b2>$) from the output port of the DUT,
comprising the following steps:
a) a setup step:
   install and bias the device under test (DUT);
   define a multitude of M frequencies Fi, with $1 \leq i \leq M$,
   define a minimum and a maximum input power supplied by the first VSG #1;
   and,
b) a scaling step:
   set a medium frequency $F=F1+(FM-F1)/2$;
   determine a center signal phase Pc of the second VSG #2 as follows:
      set the input signal power of the first VSG #1 to create a substantial $|<b2>|$;
      set the signal power P2 of the second VSG #2 to create $|<a2>| \approx |<b2>|$;
      and,
      in a phase control loop:
         increase phase $\Phi 2$ of the second VSG #2 in 10-degree increments from 0 to 360 degrees, measure $\Gamma=|<a2>|/|<b2>|$ and select $\Phi c-\Phi 2$ for maximum $\Gamma$;
      set $\Phi 2-\Phi c$;
      and,
      in a scaling process:
         increase the input power of the first VSG #1 from the minimum to the maximum value in approximately 10 equal increments, and, for each input power P1 setting, measure the departing signal $|<b2>|$ and set the signal power P2 of the second VSG #2 to create
         entering signal $|<a2>|$ approximately equal to $|<b2>|$ and save a ratio A (F, P1,$|<b2>|$)=P2/P1;
      and,
c) in a calibration pattern measurement process:
   for each frequency of the multitude M of frequencies Fi:
   step through the input power P1 settings of the scaling process and set $P2=A(Fi)*P1$,
   and, for each input power P1 setting:
   step through the phase $\Phi 2$ of the second VSG #2 from 0 to 360 degrees in 10-degree increments,
   measure Gamma=$<b2>/<a2>$ and save in a calibration file CF in a format (Fi, P1, P2, $\Phi 2$, Gamma).

2. A load pull measurement process performed using the active load pull system of claim 1 comprising:
   select an input power P1,
   select a reflection factor segment of the Smith chart for each frequency Fi;
   retrieve P1, P2, $\Phi 2$ and Gamma data from the calibration file CF into dynamic computer memory (RAM);
   for the selected input power P1, search through the retrieved data and determine a multitude N>1 of reflection factors Gamma included in the selected reflection factor segment and save;
   and,
   in a signal setting and measurements loop:
   set the second VSG #2 to the P2 and $\Phi 2$ settings associated with each of the N determined reflection factors Gamma,
   measure entering $<a2>$, departing $<b2>$ signal power waves, and RF characteristics of the DUT;
   and,
   save the RF characteristics and the associated Gamma=$<a2>/<b2>$ in a load pull file.

3. The active load pull measurement system used in the load pull measurement of claim 2 comprising:
   a device under test (DUT) as part of an active load pull tuner,
   and auxiliary measurement instruments,
wherein
the auxiliary measurement instruments comprise:
the two synchronized computer-controlled vector signal generators (VSG), the first VSG #1 connected to the input port #1 of the DUT, and the second VSG #2, connected to the output port #2 of the DUT,
and fixturing and DC biasing for the DUT;
and wherein
the active load pull tuner comprises:
   the installed and biased DUT,
   the capacity of measuring signal power waves $<a>$ entering the DUT and $<b>$ departing from the DUT using vector signal analyzers,
   the second VSG #2,
   a feedback signal power amplifier, inserted between the second VSG #2 and the output port of the DUT,
   control of the vector signal generators (VSG),
   calibration data.

4. The active load pull measurement system of claim 1 wherein
   a driver signal amplifier is inserted between the first VSG #1 and the input port of the DUT.

5. The calibration method of claim 1,
wherein
   the measurement capability of signal power waves $<a2>$ entering the output port of the DUT and $<b2>$ departing from the output port of the DUT is accomplished using a bidirectional signal coupler inserted between the output port of the DUT and the feedback signal power amplifier.

6. The measurement capability of signal power waves of claim 5,
   wherein
      the bidirectional signal coupler is connected to the vector signal analyzers.

* * * * *